United States Patent [19]

Jung et al.

[11] Patent Number: 5,804,854
[45] Date of Patent: Sep. 8, 1998

[54] MEMORY CELL ARRAY

[75] Inventors: Sung Mun Jung; Jong Ho Kim, both of Seoul, Rep. of Korea

[73] Assignee: Hyundai Electronics Industries Co., Ltd., Kyungki-do, Rep. of Korea

[21] Appl. No.: 919,401

[22] Filed: Aug. 29, 1997

[30] Foreign Application Priority Data

Aug. 30, 1996 [KR] Rep. of Korea .................. 1996-36630

[51] Int. Cl.$^6$ .................................................. H01L 29/72
[52] U.S. Cl. ........................ 257/321; 257/368; 257/390; 257/401; 257/506; 257/776
[58] Field of Search .................................... 257/321, 368, 257/390, 401, 506, 776

[56] References Cited

U.S. PATENT DOCUMENTS 5,352,619  10/1994  Hong ........................................ 257/321

*Primary Examiner*—Edward Wojciechowicz
*Attorney, Agent, or Firm*—Scott Harris, Esq.

[57] ABSTRACT

The memory cell array of the present invention has a plurality of memory cell, four memory cells hold a junction region in common. In the each memory cell, a portion of the tunnel oxide layer overlapped with the junction region is thinner than the other portion so that an individual programming operation of the each memory cell can be performed and an integration density of device can be increased.

6 Claims, 4 Drawing Sheets

MEMORY CELL ARRAY

BACKGROUND OF THE INVENTION

1. Field of the Invention

The present invention relates to a memory cell array, particularly to a memory cell array which can increase an integration density of device.

2. Description of the Prior Arts

In general, a memory device such as a flash EEPROM (electrically erasable and programmable read only memory) has electrical programming and erasing functions. The flash memory device comprises a memory cell array which has a plurality of memory cells connected between word line and bit line in matrix form and peripheral circuits. Conventional memory cell array is described through FIG. 1.

FIG. 1 is a layout to describe the conventional memory cell array. A plurality of field oxide layers 7 are formed at isolation regions of a silicon substrate. And, a plurality of floating gates 4 which are electrically isolated from the silicon substrate by a tunnel oxide layer are formed at channel regions of the silicon substrate. Both ends of each floating gate 4 are overlapped with the field oxide layers 7, respectively. A plurality of control gates 6, that is, word lines, which are isolated from the floating gates 4 by a dielectric layer, are formed on the floating gates 4. Each control gate 6 is extended to cross the field oxide layer 7. Also, source and drain regions 2A and 2B are formed on the silicon substrate corresponded to both sides of the control gate 6, respectively, and contact portions 8 for connecting to bit lines (not shown) which are crossed the control gates 6 are formed in the drain regions 2B. The construction of unit memory cell will be described with reference to FIG. 2.

FIG. 2 is a sectional view taken along the line A—A of FIG. 2. As shown in FIG. 2, a memory cell consists of a gate electrode in which a tunnel oxide layer 3, a floating gate 4, a dielectric layer 5, and a control gate 6 are stacked sequentially, a source region 2A and a drain region 2B.

Each memory cell of the memory cell array as described above is programmed by the method of hot carrier injection. The programming operation of the memory cell array is described with reference to FIG. 3.

In the programming operation of the memory cell MC using the hot carrier injection method, a supply voltage Vcc is applied to a first bit line BL1 and a high potential voltage Vpp of 9 to 12 V is applied to a first word line WL1. A ground voltage Vss is applied to a second bit line BL2 and second word line WL2, respectively. As a result, a channel is formed at the channel region of the memory cell MC by the high potential voltage applied to the first word line WL1, and high electric field region is formed at the silicon substrate 1 corresponded to both sides of the drain region 2B of the memory cell MC by the voltage applied to the first bit line BL1. At this time, some of electrons existing in the channel receive an energy from the high electric field and become hot electrons. Some of these hot electrons are injected into the floating gate 4 through the tunnel oxide layer 3 by the electric field formed in the vertical direction by the high potential voltage applied to the first word line WL1.

As described above, in the conventional memory cell array, two memory cells hold the single drain region 2B in common. Hence, in order to implement the device whose memory capacity is increased, the numbers of contact hole are increased, therefore, the area occupied by contact holes is increased, and high integration density of device become difficult.

SUMMARY OF THE INVENTION

Therefore, the object of the present invention is to provide a memory cell array in which four memory cells hold the single junction region in common to overcome the disadvantages described.

The memory cell array of the present invention comprises a plurality of field oxide layers formed at isolation regions of a silicon substrate and arranged in the form of a plurality of rows, each field oxide layer of a row is corresponded to the space between the field oxide layers of adjacent rows. The memory cell array of the present invention also comprises a plurality of floating gates formed on the silicon substrate between adjacent field oxide layers, the each floating gate is insulated from the silicon substrate by a tunnel oxide layer. A plurality of control gates are formed on the floating gates and the field oxide layers which are located at both sides of the floating gate, the each control gate is insulated from the each floating gate by a dielectric layer.

A plurality of first junction regions are formed on the silicon substrate surrounded by adjacent four field oxide layers and four floating gates, the each first junction region has a first contact portion. A plurality of second junction regions are formed on the silicon substrate surrounded by adjacent four field oxide layers and four floating gates, the each second junction regions has a second contact portion, whereby four memory cells hold the first junction region or the second junction region in common.

First bit lines are connected to the first junction regions through contact holes formed at the frist contact portions, respectively, and the each first bit line is extended to cross the control gate. Second bit lines are connected to the second junction regions through contact holes formed at the second contact portions, respectively, and the each first bit line is extended to cross the control gate.

BRIEF DESCRIPTION OF THE DRAWINGS

Other objects and advantages of the present invention will be understood by reading the detailed explanation of the embodiment with reference to the accompanying drawings in which.

DETAILED DESCRIPTION OF THE INVENTION

Figure 4:
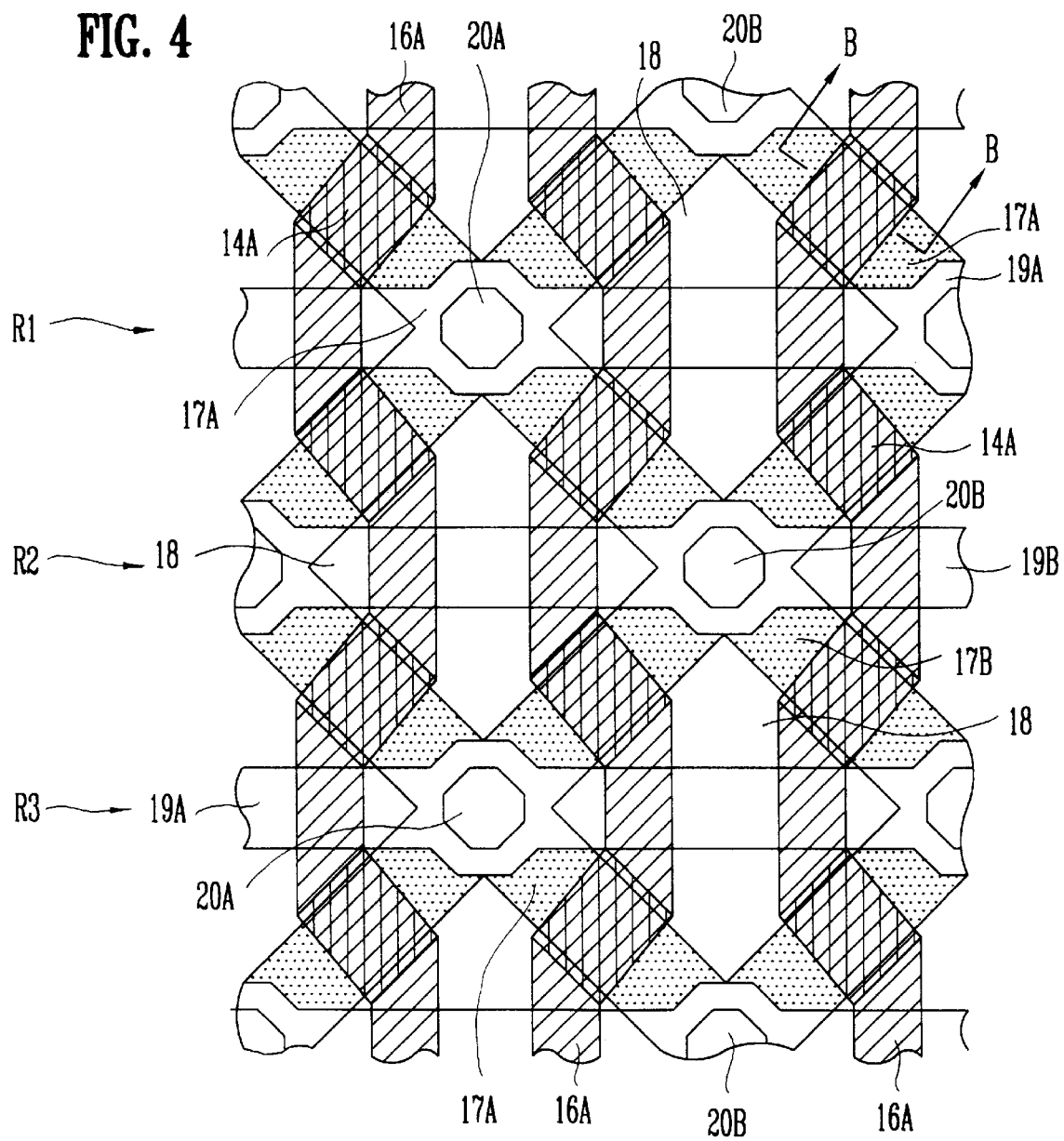
FIG. 4 is a layout to illustrate a memory cell array according to this invention.

FIG. 4 is a layout to illustrate a memory cell array according to the present invention.

A plurality of the field oxide layer 18 composed in polygonal shape, for example, in rectangular shape, are formed at isolation regions of a silicon substrate. The field oxide layers 18 are arranged in form of a plurality of rows R1, R2 ad R3. The each of field oxide layer 18 of a row, for example, R2 corresponds to the space between the field oxide layers 18 of the adjacent rows R1 and R3. A plurality of floating gates 14A are formed between the adjacent field oxide layers 18, both ends of the each floating gate 14A are overlapped with the field oxide layers 18, respectively. And, a plurality of control gates 16A are formed on the floating gates 14A and the field oxide layers 18, a width of each control gate 16A is same as that of the each floating gate 14A. As shown in FIG. 4, the each control gate 16A is formed on the each floating gate 14A formed between the field oxide layers 18 and on the field oxide layers 18 located at both sides of the floating gate 14A. Thus, two control gates 16A separately located from each other are formed on the each field oxide layer 18. At this time, the each floating gate 14A and the each control gate 16A are isolated electrically by a dielectric layer.

On the other hand, first junction regions 17A having a first contact portion 20A, respectively, or second junction regions 17B having a second contact portion 20B, respectively, are formed on the silicon substrate surrounded by adjacent four field oxide layers 18 and four floating gates 14A. Therefore, the each floating gate 16A is located between the first junction region 17A and the second junction region 17B, and the each field oxide layer 18 is located between the second junction regions 17B or between the first junction regions 17A. And the each first junction region 17A is connected to a first bit line 19A extended to cross the each control gate 16A through a contact hole (not shown) formed at the each first contact portion 20A, and the each second junction region 17B is connected to a second bit line 19B extended to cross the each control gate 16A through a contact hole (not shown) formed at the each second contact portion 20B.

FIG. 5A to FIG. 5D are sectional views taken along line B—B to describe the steps of manufacturing the memory cell shown in FIG. 4.

Figure 5A:
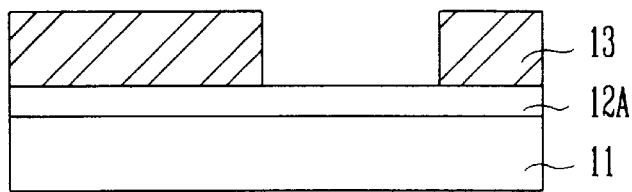
FIG. 5A to FIG. 5E are sectional views to illustrate the steps of manufacturing a memory cell array illustrated in FIG. 4.

Referring to FIG. 5A, a first oxide layer 12A and a photoresist layer 13 are formed sequentially on a silicon substrata 11, and then the photoresist layer 13 is patterned. The first oxide layer 12A is formed with thickness of 150 to 300 Å.

Figure 5B:
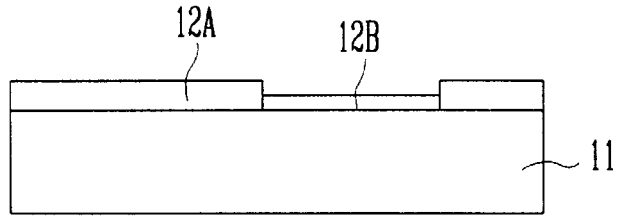

Referring to FIG. 5B, an exposed portion of the first oxide layer 12A is etched using the photoresist layer 13 as a mask, and then a second oxide layer 12B of thickness of 50 to 100 Å is formed on the exposed silicon substrate.

Figure 5C:
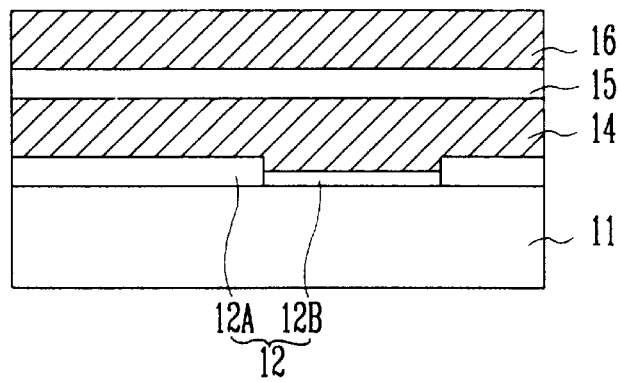

Referring to FIG. 5C, a first polysilicon layer 14, a dielectric layer 15 and a second polysilicon layer 16 are formed sequentially on a tunnel oxide layer 12 which consists of the first and second oxide layers 12A and 12B.

Figure 5D:
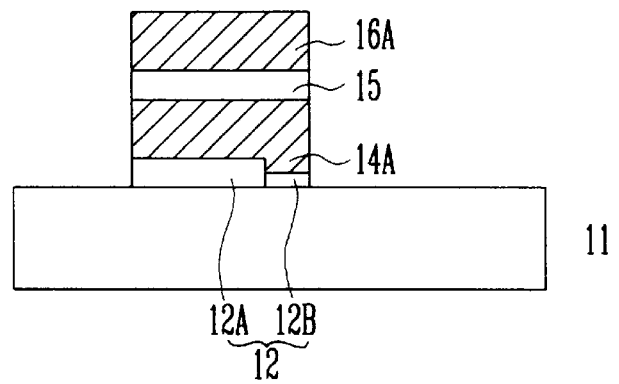

Referring to FIG. 5D, the second polysilicon layer 16, the dielectric layer 15, the first polysilicon layer 14, and the tunnel oxide layer 12 are patterned sequentially, thus a gate electrode which consists of the floating gate 14A, the dielectric layer 15, and the control gate 16A is formed. When the tunnel oxide layer 12 which consists of the first oxide layer 12A and the second oxide layer 12B is patterned, the width of the first oxide layer 12A is wider than that of the second oxide layer 12B.

Figure 5E:
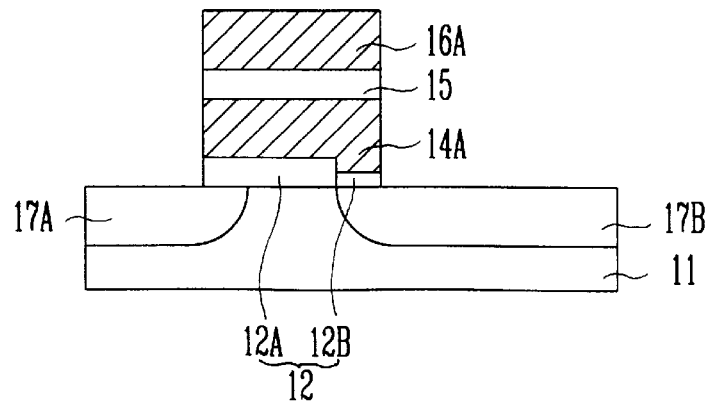

As shown in FIG. 5E, impurity ions are injected into the silicon substrate corresponded to both sides of the gate electrode, and then thermal process is performed so that the first and second junction regions 17A and 17B are formed. At this time, the first junction region 17B is diffused toward the lower portion of the gate electrode so that a portion of the first junction region 17B is located under the second oxide layer 12B.

Figure 1:
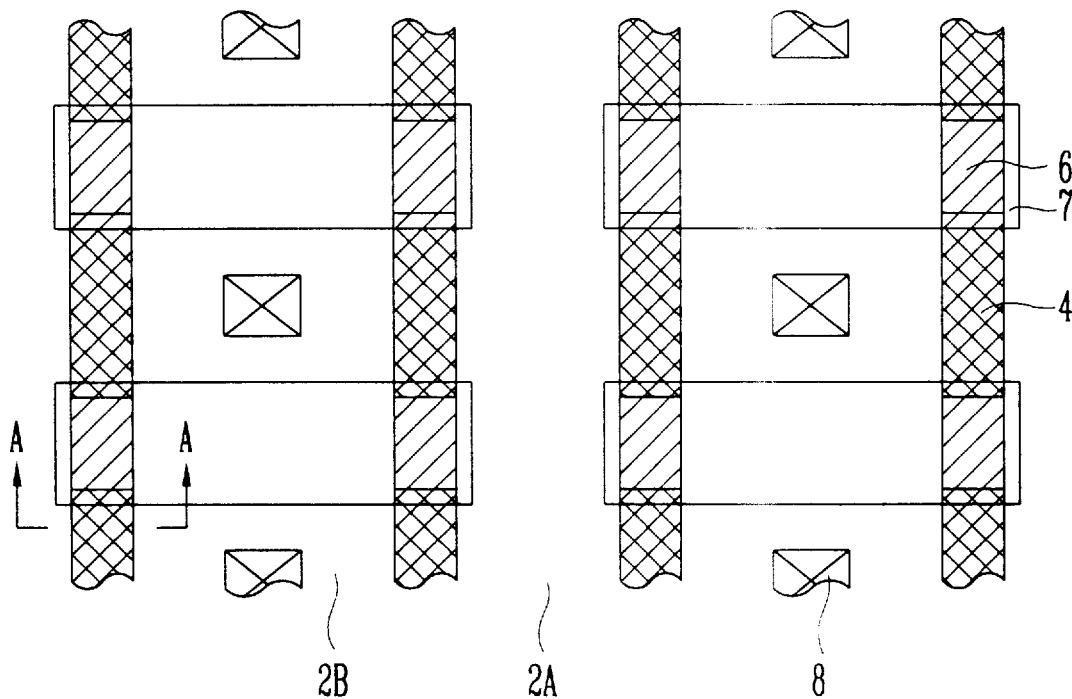
FIG. 1 is a layout to illustrate a memory cell array of the prior art.
Figure 2:
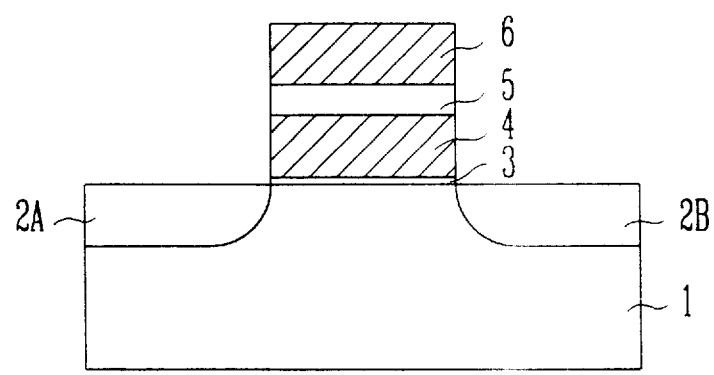
FIG. 2 is a sectional view taken along the line A—A of FIG. 2.
Figure 3:
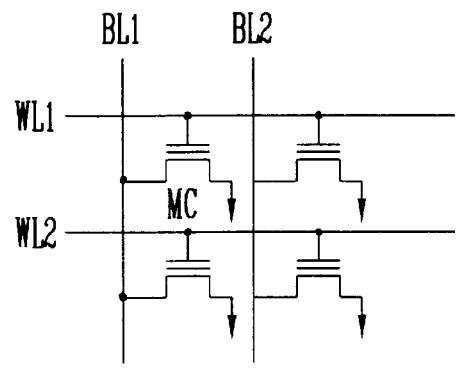
FIG. 3 is a circuit of a memory cell array to illustrate the programming method of the prior art.

Each memory cell of the memory cell array as described above can be programmed by hot carrier injection method or F-N tunneling method. However, prior to describe a method of programming the memory cell array according to this invention, the programming operation of the memory cell array of the present invention, which has the conventional memory cells as shown in FIG. 2.

In the programming operation of the memory cell MC2 using the hot carrier injection method, a high potential voltage Vpp is applied to a first word line WL1, a ground voltage Vss is applied to a second word line WL2. The ground voltage Vss is applied to a first and second bit lines BL1 and BL2, respectively, and a supply voltage Vcc is applied to a third and fourth bit lines BL3 and BL4, respectively. As a result, a channel is formed at the channel region of the memory cell MC2 by the high potential voltage Vpp applied to the first word line WL1, and high electric field region is formed at the silicon substrate 1 corresponded to both sides of the drain region 2B of the memory cell MG2 by the supply voltage Vcc applied to the third bit line BL3. At this time, some of electrons existing in the channel receive an energy from the high electric field and become hot electrons. Some of hot electrons are injected into the floating gate 4 through the tunnel oxide layer 3 by the electric field formed in the vertical direction by the high potential voltage applied to the first word line WL1. However, in this case, since supply voltage Vcc is applied to the source region 2A as well as the drain region 2B of a memory cell MC3 located at right side of the memory cell MC2, the electric effects like punchthrough, etc. are generated.

Also, in order to prevent a generating the electric effects described above, the memory cell shown in FIG. 2 can be programmed by F-N tunneling method.

In the programming operation of the memory cell MC2 using the F-N tunneling method, the high potential voltage Vpp of 9 to 12V is applied to the first word line WL1, and the supply voltage Vcc of about 5V is applied to the third bit line BL3. And, the first, second, and fourth bit lines be in a floating state. Thus, since high potential voltage Vpp is applied to the control gate 6 of the memory cell MC2 through the first word line WL1 and supply voltage Vcc is applied to the drain region 2B through the third bit line BL3, electrons existing in the drain region 2B drift toward the floating gate 4 through the tunnel oxide layer 3 by F-N tunneling phenomenon. However, in case of using F-N tunneling method as described, since the source regions 2A or the drain regions 2B of the memory cells MC2 and MC3 are connected to the third bit line in common, the memory cell MC2 as well as the memory ell MC3 are synchronously programmed.

Figure 6:
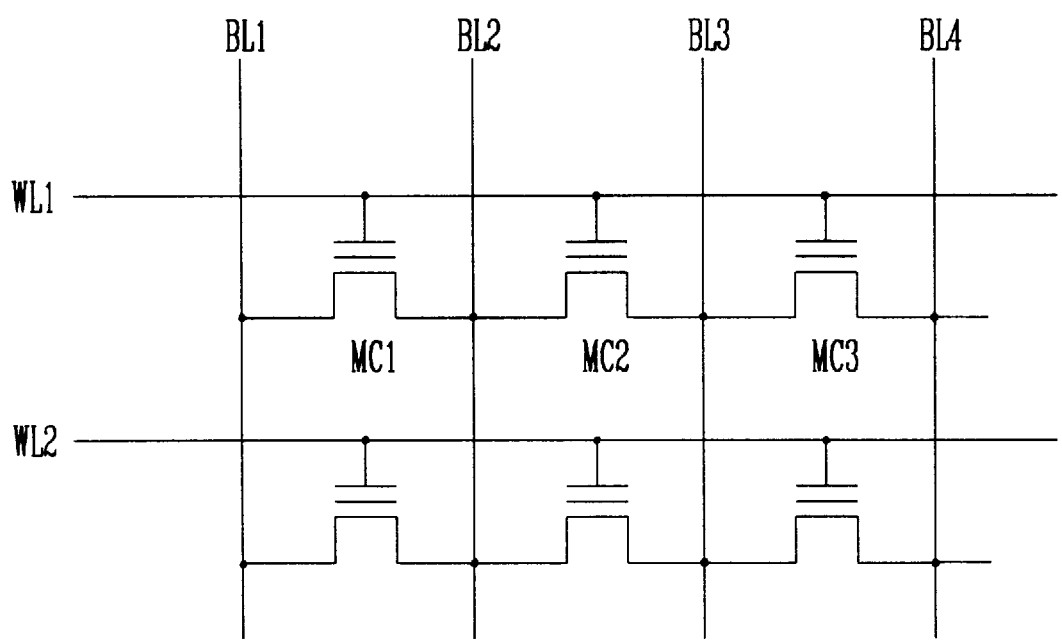
FIG. 6 is a circuit of a memory cell array to describe the programming operation of a memory cell array according to this invention.

In the present invention, the memory cell array having a plurality of the memory cell as shown in FIG. 5 is constructed. Then, the programming operation of the memory cell in the memory cell array in accordance with the present invention will be described reference with FIG. 6.

In the programming operation of the memory cell MC2, high potential voltage Vpp of 9 to 12V is applied to the first word line WL1, and supply voltage Vcc of about 5V is applied to the third bit line BL3. Also, the first, second and fourth bit lines are in a floating state, respectively. Thus, since high potential voltage Vpp is applied to the control gate 16A of the memory cell MC2 though the first word line WL1, and supply voltage Vcc is applied to the second junction region 17B through the third bit line BL3, electrons existing in the second junction region 17B drift toward the floating gate 14A through the tunnel oxide layer 12 by F-N tunneling phenomenon.

At this time, in the tunnel oxide layer 12 of the memory cell MC3 which is adjacent to the memory cell MC2 and to which the supply voltage is applied through the second junction region 17B connected to the third bit line BL3, since the tunnel oxide layer 12 which is adjacent to the second junction region 17B is made of the first oxide layer 12A, electrons existing in the second junction region 17B cannot drift toward the floating gate 14A. Therefore, the other memory cells except the memory cell MC2 will not be programmed.

As described above, in the memory cell array of the present invention, four memory cells hold the single junction region in common. And, in the memory cell, a thickness of the tunnel oxide layer which is overlapped with the junction region is thinner than that of other portion. And the individual programming operation of the each memory cell can be performed by a F-N tunneling method. Therefore, according to this invention, the number of contact holes decreases, thus high integration density can be made easier, and the stability and efficiency of a programming operation can be advanced.

The foregoing description, although described in its preferred embodiments with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A memory cell array comprising;

a plurality of field oxide layers formed at isolation regions of a silicon substrate and arranged in the form of a plurality of rows, said each field oxide layer of a row corresponded to the space between said field oxide layers of adjacent rows;

a plurality of floating gates formed on said silicon substrate between adjacent field oxide layers, said each floating gate insulated from said silicon substrate by a tunnel oxide layer;

a plurality of control gates formed on said floating gate and said field oxide layers which are located at both sides of said floating gate, said each control gate insulated from said each floating gate by a dielectric layer;

a plurality of first junction regions formed on said silicon substrate surrounded by adjacent four field oxide layers and four floating gates, said each first junction region having a first contact portion;

a plurality of second junction regions formed on said silicon substrate surrounded by adjacent four field oxide layers and four floating gates, said each second junction regions having a second contact portion, whereby four memory cells hold said first junction region or said second junction region in common;

first bit lines connected to said first junction regions through contact holes formed at said frist contact portions, respectively, said each first bit line extended to cross said control gate;

second bit lines connected to said second junction regions through contact holes formed at said second contact portions, respectively, said each first bit line extended to cross said control gate.

2. The memory cell array in claim 1, wherein said each field oxide layer is formed with rectangular shape.

3. The memory cell array in claim 1, wherein said each memory cell comprises;

a gate electrode having a tunnel oxide layer, a floating gate, a dielectric layer and a control gate stacked sequentially on said the silicon substrate;

a first junction region and a second junction which are partially overlapped with said gate electrode, respectively.

4. The memory cell array in claim 3, wherein a thickness of said tunnel oxide layer overlapped with said second junction region is thinner than that of other portion.

5. The memory cell array in claim 4, wherein the thickness of said tunnel oxide layer overlapped with said second junction region is 50 to 100 Å.

6. The memory cell array in claim 1, wherein said each memory cell is programmed by making high potential voltage be applied to said control gate, supply voltage be applied to said second junction region, and said first junction region be in a floating state.

* * * * *